United States Patent
Liu et al.

(10) Patent No.: US 11,424,232 B2
(45) Date of Patent: Aug. 23, 2022

(54) DISPLAY STRUCTURE AND PREPARATION METHOD THEREOF, AND DISPLAY APPARATUS

(71) Applicant: BOE Technology Group Co., Ltd., Beijing (CN)

(72) Inventors: Yingwei Liu, Beijing (CN); Ke Wang, Beijing (CN); Zhiwei Liang, Beijing (CN); Muxin Di, Beijing (CN); Zhanfeng Cao, Beijing (CN); Shuang Liang, Beijing (CN); Guangcai Yuan, Beijing (CN); Qi Yao, Beijing (CN); Dongni Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 109 days.

(21) Appl. No.: 16/920,771

(22) Filed: Jul. 6, 2020

(65) Prior Publication Data
US 2021/0043619 A1 Feb. 11, 2021

(30) Foreign Application Priority Data
Aug. 9, 2019 (CN) .......................... 201910734585.2

(51) Int. Cl.
*H01L 23/538* (2006.01)
*H01L 25/18* (2006.01)
(Continued)

(52) U.S. Cl.
CPC .......... *H01L 25/18* (2013.01); *H01L 23/5387* (2013.01); *H01L 24/32* (2013.01); *H01L 25/50* (2013.01); *H01L 25/167* (2013.01); *H01L 2224/3223* (2013.01); *H01L 2224/32111* (2013.01)

(58) Field of Classification Search
CPC ..... H01L 25/18; H01L 23/5387; H01L 24/32; H01L 25/50; H01L 25/167; H01L 2224/32111; H01L 2224/3223; H01L 27/156; H01L 21/4814; H01L 21/4885;
(Continued)

(56) References Cited

U.S. PATENT DOCUMENTS

2016/0336532 A1 11/2016 Li
2017/0323935 A1 11/2017 Tsuruoka et al.
(Continued)

FOREIGN PATENT DOCUMENTS

CN 104851892 A 8/2015
CN 105009188 A 10/2015
(Continued)

OTHER PUBLICATIONS

Office Action dated Jul. 29, 2020 for Chinese Patent Application No. 201910734585.2 and English Translation.

*Primary Examiner* — Elias Ullah
(74) *Attorney, Agent, or Firm* — Ling Wu; Stephen Yang; Ling and Yang Intellectual Property

(57) ABSTRACT

Provided are a display structure and a preparation method thereof, and a display apparatus. The display structure includes a flexible back plate and a display substrate which are stacked, the flexible back plate including a bonding electrode for bonding to an integrated circuit chip, and the flexible back plate being bent to form a bent portion on which the bonding electrode is located.

16 Claims, 5 Drawing Sheets

(51) Int. Cl.
  *H01L 23/00*  (2006.01)
  *H01L 25/00*  (2006.01)
  *H01L 25/16*  (2006.01)

(58) Field of Classification Search
  CPC ....... H01L 23/481; H01L 23/49; H01L 23/50; G09F 9/301; G09F 9/33
  See application file for complete search history.

(56) References Cited

U.S. PATENT DOCUMENTS

2019/0181212 A1   6/2019  Koh et al.
2019/0252327 A1*  8/2019  Hachisu ................ H01L 27/146

FOREIGN PATENT DOCUMENTS

CN   110034088 A   7/2019
EP      2951808 B1   1/2020

* cited by examiner

DISPLAY STRUCTURE AND PREPARATION METHOD THEREOF, AND DISPLAY APPARATUS

CROSS-REFERENCE TO RELATED APPLICATION

This application claims the priority of Chinese Patent Application No. 201910734585.2 filed to the CNIPA on Aug. 9, 2019, the content of which is hereby incorporated by reference.

TECHNICAL FIELD

The present disclosure relates to, but is not limited to, the field of display technology, and particularly to a display structure and a preparation method thereof, and a display apparatus.

BACKGROUND

As a composite integration technology combining display technology and light emitting diode light emitting technology, Mini/Micro Light-Emitting Diodes have many advantages such as self-luminescence, high efficiency, low power consumption, high integration and high stability, and have a broad market prospect. Micro light-emitting diode display technology requires tens of millions of RGB or monochrome micro light-emitting diode chips to be transferred to a display substrate to realize a large-size display. In order to realize the large-size splicing for micro light-emitting diode display, it is required that a back plate has a very narrow border. However, in the existing micro light-emitting diode display technology, a back plate with a narrow border or without a border cannot be realized after a back plate is attached to a display substrate.

SUMMARY

The following is a summary of the subject matter described in detail herein. This summary is not intended to limit the scope of protection of the claims.

A display structure includes a flexible back plate and a display substrate which are stacked, the flexible back plate including a bonding electrode for bonding to an integrated circuit chip, and the flexible back plate being bent to form a bent portion on which the bonding electrode is located.

In an exemplary embodiment, the bonding electrode is connected to the integrated circuit chip.

In an exemplary embodiment, the display substrate covers the integrated circuit chip.

In an exemplary embodiment, the display substrate includes a base substrate and a drive circuit layer formed on the base substrate.

In an exemplary embodiment, the drive circuit layer includes a connection electrode and a through hole for connecting the connection electrode to the flexible back plate.

In an exemplary embodiment, the through hole respectively penetrates the drive circuit layer and the base substrate.

In an exemplary embodiment, the flexible back plate further includes a flexible base substrate, a post spacer formed on the flexible base substrate, and a first electrode layer formed on the flexible base substrate and the post spacer, the post spacer being inserted into the through hole to electrically connect the first electrode layer on the post spacer to the connection electrode.

In an exemplary embodiment, a conductive paste layer is provided in the through hole, and the conductive paste layer electrically connects the first electrode layer to the connection electrode.

In an exemplary embodiment, the conductive paste layer is made of Ag paste or Cu paste.

In an exemplary embodiment, the flexible back plate further includes a passivation layer formed on the first electrode layer other than the post spacer, the passivation layer is provided with an opening communicating with the first electrode layer, and the bonding electrode is formed on the passivation layer and electrically connected to the first electrode layer through the opening.

In an exemplary embodiment, a height of the post spacer is greater than 10 um.

In an exemplary embodiment, the flexible back plate further includes a flexible base substrate and a first electrode layer formed on the flexible base substrate, a metal conductive layer is formed on the first electrode layer, and the metal conductive layer electrically connects the first electrode layer to the connection electrode.

In an exemplary embodiment, the drive circuit layer further includes a contact electrode configured to be connected to a light emitting unit disposed on the display substrate, and the connection electrode is connected to the contact electrode.

In an exemplary embodiment, the connection electrode is located on a top of the drive circuit layer.

In an exemplary embodiment, a heat-resistant adhesive layer is provided on the flexible back plate, and the heat-resistant adhesive layer is located between the flexible back plate and the display substrate.

An embodiment of the present disclosure further provides a display apparatus, including any one of the above-mentioned display structures.

An embodiment of the present disclosure further provides a preparation method for a display structure, including: attaching a display substrate to a flexible back plate; and bending the flexible back plate to form a bent portion, a bonding electrode on the flexible back plate being located on the bent portion.

Other aspects will become apparent upon reading and understanding the drawings and detailed description.

BRIEF DESCRIPTION OF DRAWINGS

The accompanying drawings are used to provide a further understanding of the technical solutions of the present disclosure and form a part of the specification. Together with the embodiments of the present disclosure, they are used to explain the technical solutions of the present disclosure and do not constitute a limitation on the technical solutions of the present disclosure. The shapes and dimensions of the components in the drawings do not reflect real proportions, and are only for the purpose of schematically illustrating the content of the present disclosure.

Figure 1:
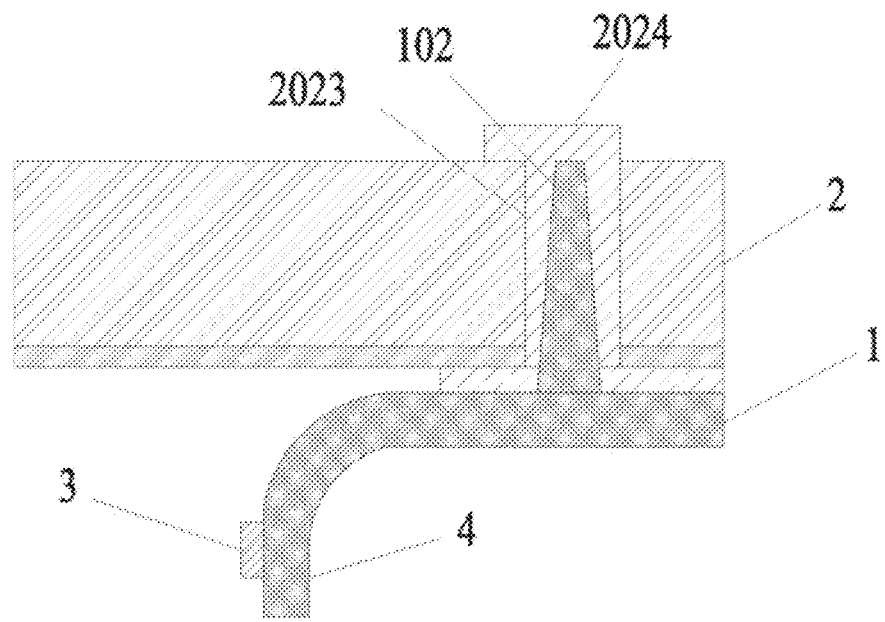
FIG. 1 is a schematic structural view of a display structure according to an embodiment of the present disclosure.

Reference signs in the drawings are explained below.

1-flexible back plate; 2-display substrate; 3-bonding electrode; 4-bent portion; 5-integrated circuit chip; 6-heat-resistant adhesive layer; 101-flexible base substrate; 102-post spacer; 103-first electrode layer; 104-passivation layer; 105-metal conductive layer; 201-base substrate; 202-drive circuit layer; 2021-contact electrode; 2022-connection electrode; 2023-through hole; and 2024-conductive paste layer.

DETAILED DESCRIPTION

The embodiments herein may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments in the present disclosure and the features in the embodiments may be combined with each other arbitrarily if there is no conflict.

FIG. 1 is a schematic structural view of a display structure according to an embodiment of the present disclosure. As shown in FIG. 1, the present disclosure provides a display structure, including a flexible back plate 1 and a display substrate 2 which are stacked. The flexible back plate 1 includes a bonding electrode 3 for bonding to an integrated circuit chip. The flexible back plate 1 is bent in a direction away from the display substrate 2 to form a bent portion 4 on which the bonding electrode 3 is located. In the present disclosure, by bending the flexible back plate, the bonding electrode on the flexible back plate is located on a bent portion, thereby increasing a bonding space of the bonding electrode and facilitating the bonding of the bonding electrode. Moreover, the bonding electrode is located on the bent portion, so that the bonding electrode can be covered by the display substrate, that is, the bonding electrode can be located below the display substrate, so that an integrated circuit chip can be covered by the display substrate after being bonded to the bonding electrode. In this way, there is no need to provide a border for the bonding of the bonding electrode, and a back plate with a narrow border or without a border is realized.

As shown in FIG. 1, the display structure of the present disclosure includes a flexible back plate 1 and a display substrate 2 which are stacked. The flexible back plate 1 includes a bonding electrode 3 for bonding to an integrated circuit chip. An edge portion of the flexible back plate 1 is bent in a direction away from the display substrate 2 to form a bent portion 4 on which the bonding electrode 3 is located.

Figure 2:
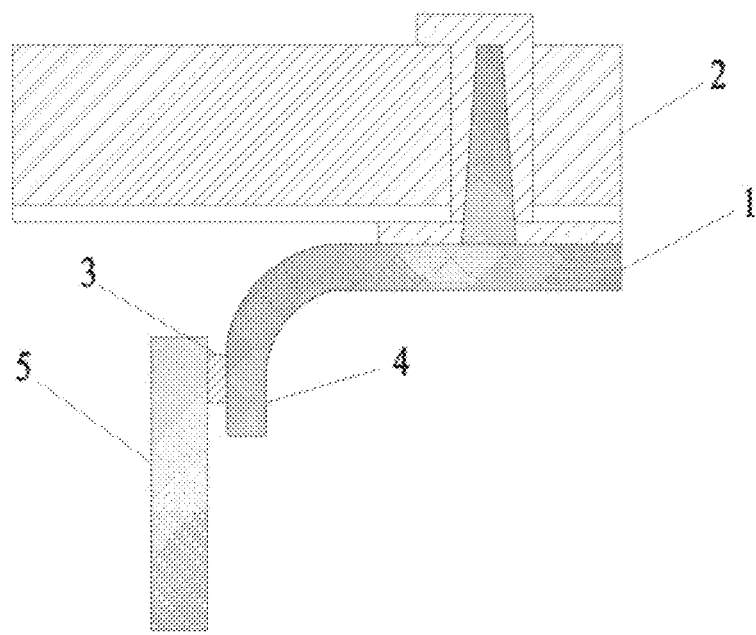
FIG. 2 is a schematic structural view of a display structure in which a bonding electrode is bonded to an integrated circuit chip according to an embodiment of the present disclosure.

FIG. 2 is a schematic structural view of a display structure in which a bonding electrode is bonded to an integrated circuit chip according to an embodiment of the present disclosure. As shown in FIG. 2, a bent portion 4 of a flexible back plate 1 is completely covered by a display substrate 2, that is, the bent portion 4 of the flexible back plate 1 is located directly below the display substrate 2. An integrated circuit chip 5 is connected to a bonding electrode 3 on the bent portion 4. After the integrated circuit chip 5 is bonded to the bonding electrode 3, it is completely covered by the display substrate 2, that is, the integrated circuit chip 5 is located directly below the display substrate 2. Therefore, the back plate does not need to be provided with a border for accommodating bonding of the bonding electrode 3 to the integrated circuit chip 5, thereby realizing a back plate with a narrow border or without a border.

In the present disclosure, the bonding electrode 3 is provided on the bent portion 4 of the flexible back plate 1, which avoids the transfer of micro light-emitting diodes due to two-sided exposure of the bonding electrode 3 to the outside, avoids the circuit scratch in the process of bonding the bonding electrode 3 to the integrated circuit chip 5 and influence of high temperatures in the bonding process on the display substrate and micro light-emitting diodes, and reduces the defect rate.

Figure 3:
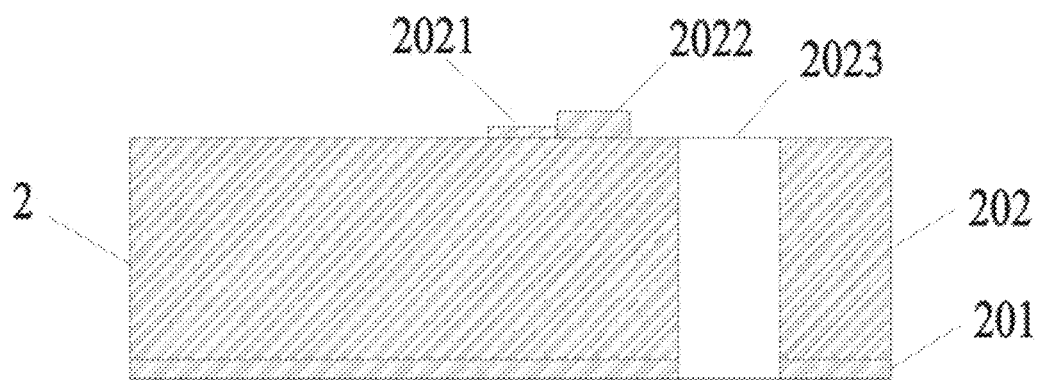
FIG. 3 is a schematic structural view of a display substrate of a display structure according to an embodiment of the present disclosure.

FIG. 3 is a schematic structural view of a display substrate of a display structure according to an embodiment of the present disclosure. As shown in FIG. 3, the display substrate 2 includes a base substrate 201 and a drive circuit layer 202 formed on the base substrate 201. The drive circuit layer 202 includes a common electrode, a thin film transistor, an auxiliary electrode, a contact electrode 2021, and a connection electrode 2022. The contact electrode 2021 is configured to be connected to a light emitting unit disposed on the display substrate. The light emitting unit is an OLED light emitting unit. The connection electrode 2022 is located at the top of the drive circuit layer 202 and is connected to the contact electrode 2021 for electrically connecting the contact electrode 2021 with a first electrode layer on the flexible back plate 1, so that the electrical connection of the flexible back plate 1 to the display substrate 2 is realized. The drive circuit layer 202 further includes a through hole 2023 for connecting the connection electrode 2022 to the flexible back plate 1, and the through hole 2023 respectively penetrates the drive circuit layer 202 and the base substrate 201.

As to the connection between the display substrate and the flexible back plate, the general practice is to fill the through hole with a metal filler, which is mainly copper, after the display substrate is attached to the flexible back plate, to electrically connect the contact electrode of the display substrate with the first electrode layer on the flexible back plate by the metal filler in the through hole. However, due to a difference in thermal expansion coefficient between a high-thickness metal filler and a material of the display substrate, in the technological process, such as high-temperature annealing or high-temperature deposition, of a thin film in the process of the display substrate, the metal filler may swell at a high temperature, and the metal on the display substrate in contact with the metal filler will break at a position where the metal filler comes into contact with the display substrate, causing the display substrate to break, and resulting in an open circuit of the circuit of the display substrate.

Figure 4:
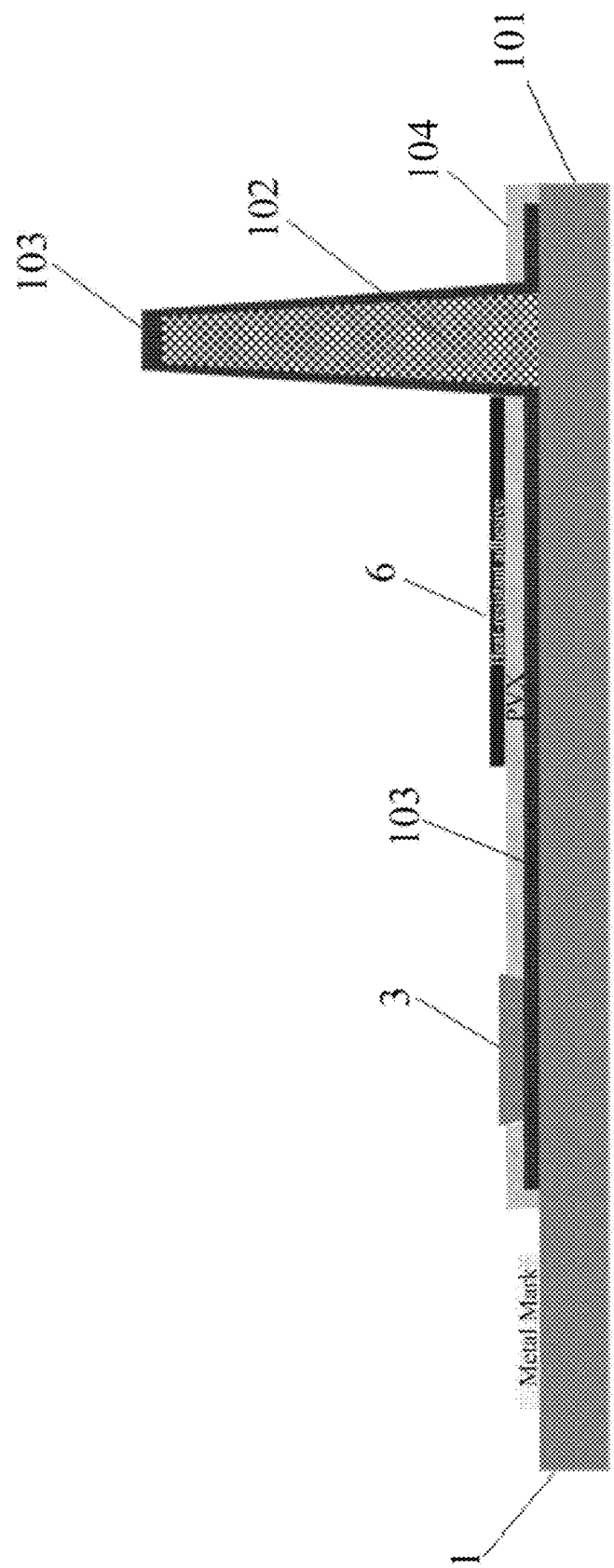
FIG. 4 is a schematic structural view of a flexible back plate of a display structure according to an embodiment of the present disclosure.

FIG. 4 is a schematic structural view of a flexible back plate of a display structure according to an embodiment of the present disclosure. As shown in FIGS. 1 and 4, the flexible back plate 1 according to an embodiment of the present disclosure includes a flexible base substrate 101, a post spacer 102 formed on a side, close to the display substrate 2, of the flexible base substrate 101, and a first electrode layer 103 formed on the flexible base substrate 101 and the post spacer 102. After the flexible back plate 1 is attached to the display substrate 2, the post spacer 102 is inserted into the through hole of the display substrate 2, so that the first electrode layer 103 on the post spacer 102 is electrically connected with the connection electrode on the display substrate 2, thereby realizing the electrical connection between the flexible back plate 1 and the display substrate 2. The post spacer 102 is a pattern formed by exposure of patternable resin having a height greater than 10 um.

In this embodiment, by the post spacer on the flexible back plate cooperating with the through hole on the display substrate, electrical connection between the first electrode layer on the flexible back plate and the connection electrode of the display substrate is realized, thereby avoiding breakage of the display substrate caused by expansion of the metal filler at a high temperature due to the difference in thermal expansion coefficient between the metal filler in the through hole and the display substrate.

As shown in FIG. 1, a conductive paste layer 2024 is provided in the through hole 2023 of the display substrate 2. The conductive paste layer 2024 is used to fill a gap between the post spacer 102 and the through hole 2023 and electrically connect the first electrode layer on the post spacer 102 to the connection electrode on the display substrate 2.

As shown in FIG. 1, a heat-resistant adhesive layer 6 is further provided on the flexible back plate 1. The heat-resistant adhesive layer 6 is located between the flexible back plate 1 and the display substrate 2 for attaching the flexible back plate 1 to the display substrate 2.

A technical solution of the present disclosure is described below by an example of a preparation process of a display substrate. A preparation process of a display structure includes the following operations.

(1) Forming a display substrate. Forming a display substrate includes: coating a polyimide layer (PI layer) onto a surface of a first glass base plate to form a base substrate 201, and etching an electrode hole having a hole diameter less than a pixel size; then preparing a common electrode, a thin film transistor, an auxiliary electrode, a contact electrode 2021 and a connection electrode 2022 on the base substrate 201 according to a patterning process to form a drive circuit layer 202; wherein the connection electrode 2022 is electrically connected to the contact electrode 2021, and the connection electrode 2022 and the contact electrode 2021 are both located at the top of the drive circuit layer 202; in the process of preparing the above patterns, no pattern is left in the electrode hole region of the base substrate 201, so as to form a through hole 2023 penetrating the drive circuit layer 202 and the base substrate 201; and finally, stripping off the first glass base plate to form a display substrate 2, as shown in FIG. 3.

(2) Forming a flexible back plate. Forming a flexible back plate includes: coating a polyimide layer (PI layer) onto a surface of a second glass base plate to form a flexible base substrate 101; then depositing a high-thickness post spacer 102 on the flexible base substrate 101; forming a first electrode layer 103 on the post spacer 102 and the flexible base substrate 101; forming a passivation layer 104 on the first electrode layer 103, the passivation layer 104 covering the first electrode layer 103 other than the post spacer 102; providing, on the passivation layer 104, a first opening communicating with the first electrode layer 103; forming a bonding electrode 3 on the passivation layer 104, the bonding electrode 3 penetrating the first opening on the passivation layer 104 and being electrically connected to the first electrode layer 103; and finally, forming a heat-resistant adhesive layer 6 on the passivation layer 104, as shown in FIG. 4.

Figure 5:
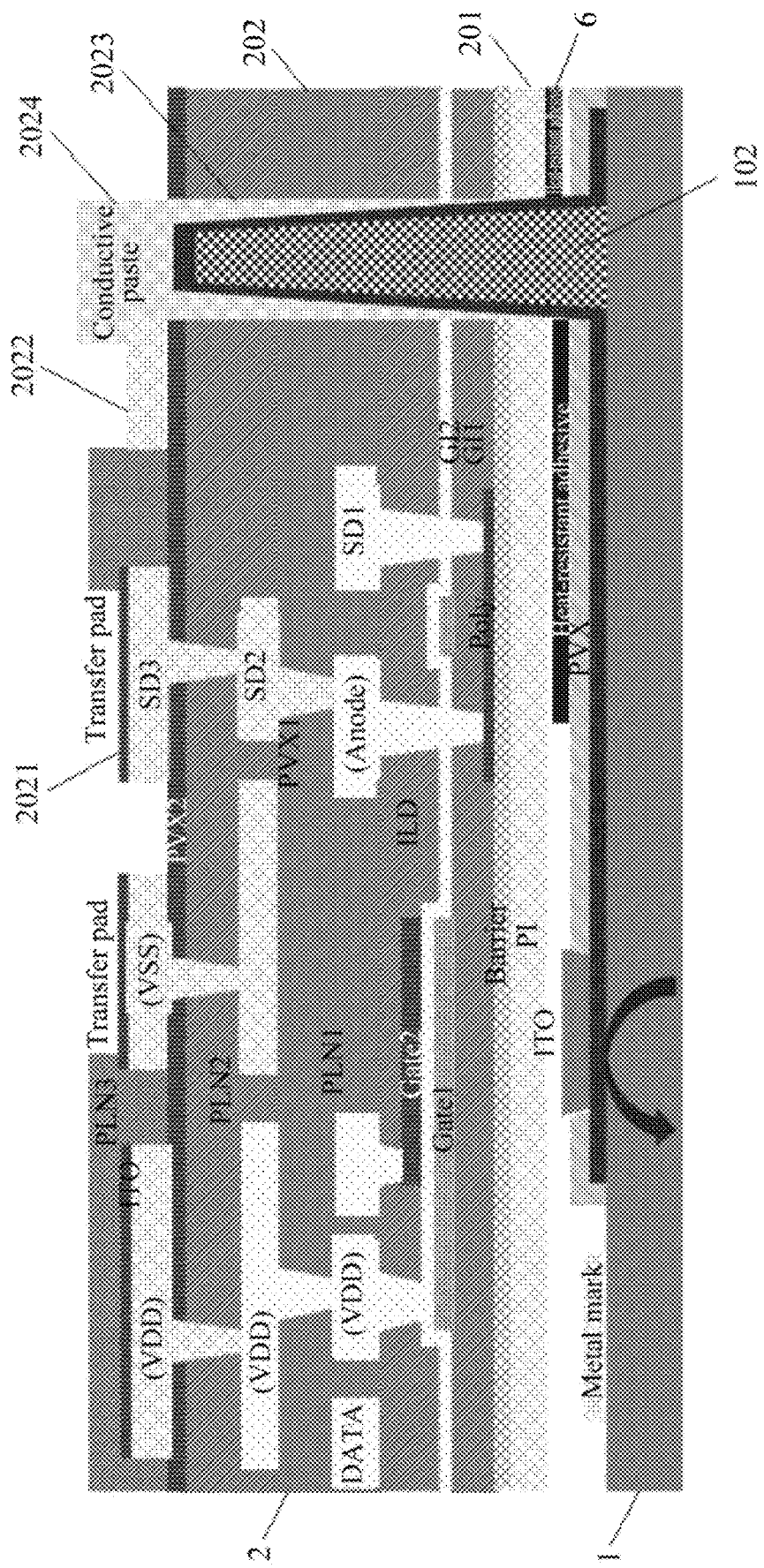
FIG. 5 is a schematic structural view of a display structure in which a display substrate is attached to a flexible back plate according to an embodiment of the present disclosure.

(3) Attaching the display substrate to the flexible back plate. Attaching the display substrate to the flexible back plate includes: attaching the base substrate 201 of the display substrate 2 to the heat-resistant adhesive layer 6 on the flexible back plate 1, and inserting the post spacer 102 on the flexible back plate 1 into the through hole 2023 on the display substrate 2; and then forming a conductive paste layer 2024 in the through hole 2023, the conductive paste layer 2024 electrically connecting the first electrode layer on the post spacer 102 with the connection electrode 2022 on the display substrate 2; wherein the conductive paste layer 2024 is made of Ag paste or Cu paste, as shown in FIG. 5.

(4) Bonding the flexible back plate to an integrated circuit chip. Bonding the flexible back plate to an integrated circuit chip includes: bending a portion, provided with the bonding electrode 3, of the flexible back plate 1 in a direction away from the display substrate 2 to form a bent portion 4, the bonding electrode 3 being located on the bent portion 4; and then bonding an integrated circuit chip 5 to the bonding electrode 3 so that the integrated circuit chip 5 is located below the display substrate 2, as shown in FIG. 2.

Figure 6:
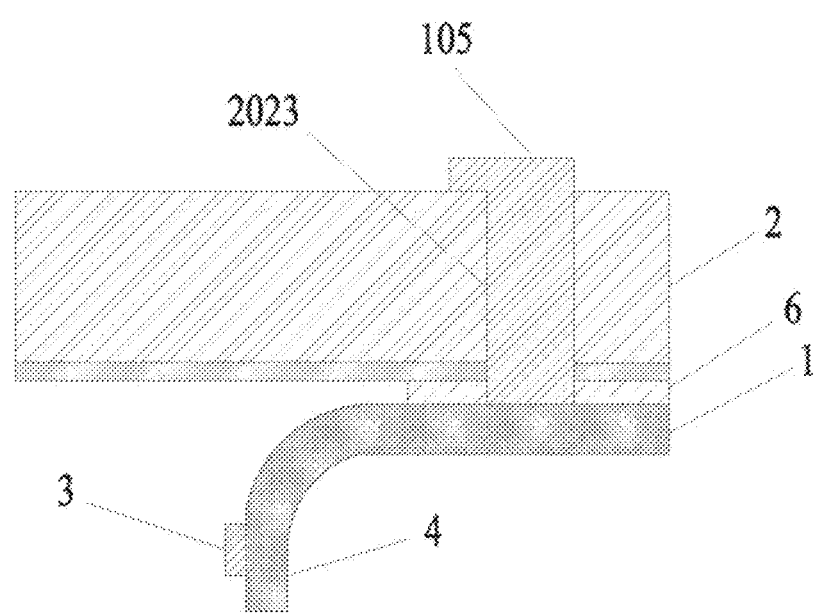
FIG. 6 is a schematic structural view of a display structure in which a bonding electrode is bonded to an integrated circuit chip according to an embodiment of the present disclosure.

FIG. 6 is a schematic structural view of a display structure in which a bonding electrode is bonded to an integrated circuit chip according to an embodiment of the present disclosure. As shown in FIG. 6, a display structure according to an embodiment of the present disclosure is similar to the structure described in any one of the previous embodiments, except that the flexible back plate 1 includes a flexible base substrate, a first electrode layer formed on the flexible base substrate, and a metal conductive layer 105 formed on the first electrode layer, the metal conductive layer 105 electrically connecting the first electrode layer of the flexible back plate 1 with the connection electrode of the display substrate 2.

In an exemplary embodiment, a method for forming a metal conductive layer includes:

(1) Forming a flexible back plate. Forming a flexible back plate includes: forming a flexible base substrate; forming a first electrode layer on the flexible base substrate; forming a passivation layer on the first electrode layer, and etching, on the passivation layer, a through hole communicating with the first electrode layer; and forming a heat-resistant adhesive layer on the passivation layer, the heat-resistant adhesive layer leaving no pattern at the through hole of the passivation layer, to form a second opening communicating with the first electrode layer.

(2) Attaching a display substrate to the flexible back plate. Attaching a display substrate to the flexible back plate includes: attaching a base substrate of a display substrate 2 to the heat-resistant adhesive layer 6 on the flexible back plate 1, making the second opening on the flexible back plate 1 correspond to a through hole 2023 on the display substrate 2, then filling the through hole 2023 of the display substrate 2 by an electroless plating process or a direct Ag paste method, using the first electrode layer in the second opening of the flexible back plate 1 as a seed layer, to form a metal conductive layer 105 in the through hole, and electrically connecting the connection electrode of the display substrate 2 with the first electrode layer of the flexible back plate 1 by the metal conductive layer 105, as shown in FIG. 6.

The present disclosure further provides a display apparatus, including the display structure according to any one of the previous embodiments.

In the description of the present disclosure, it should be understood that the azimuth or position relationship indicated by the terms "middle", "upper", "lower", "front", "rear", "vertical", "horizontal", "top", "bottom", "inner", "outer" and the like is based on the azimuth or position relationship shown in the drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of the present disclosure, it should be noted that, unless otherwise clearly specified or defined, the term "install", "connect" or "link" should be broadly interpreted, for example, it may be fixed connection, detachable connection, or integral connection; it may be a mechanical connection or an electrical connection; and it may be direct connection, indirect connection through an intermediary, or an internal connection between two elements. Those of ordinary skills in the art can understand the specific meanings of the above terms in the present disclosure according to specific situations.

Although the embodiments disclosed in the present disclosure are as described above, the described contents are only the embodiments for facilitating understanding of the present disclosure, which are not intended to limit the present disclosure. Any person skilled in the art to which the present disclosure pertains can make any modifications and variations in the form and details of implementation without departing from the spirit and scope of the present disclosure. Nevertheless, the scope of patent protection of the present application shall still be determined by the scope as defined by the appended claims.

What we claim is:

1. A display structure, comprising a flexible back plate and a display substrate which are stacked, wherein the flexible back plate comprises a bonding electrode for bonding to an integrated circuit chip, and the flexible back plate is bent to form a bent portion on which the bonding electrode is located,
    wherein the flexible back plate further comprises a flexible base substrate, a post spacer formed on the flexible base substrate, and a first electrode layer formed on the flexible base substrate and the post spacer, and
    wherein the flexible back plate further comprises a passivation layer formed on the first electrode layer other than the post spacer, the passivation layer is provided with an opening communicating with the first electrode layer, and the bonding electrode is formed on the passivation layer and electrically connected to the first electrode layer through the opening.

2. The display structure according to claim 1, wherein the bonding electrode is connected to the integrated circuit chip.

3. The display structure according to claim 2, wherein the display substrate covers the integrated circuit chip.

4. The display structure according to claim 1, wherein the display substrate comprises a base substrate and a drive circuit layer formed on the base substrate.

5. The display structure according to claim 4, wherein the drive circuit layer comprises a connection electrode and a through hole for connecting the connection electrode to the flexible back plate.

6. The display structure according to claim 5, wherein the through hole respectively penetrates the drive circuit layer and the base substrate.

7. The display structure according to claim 5, wherein the post spacer is inserted into the through hole to electrically connect the first electrode layer on the post spacer to the connection electrode.

8. The display structure according to claim 7, wherein a conductive paste layer is provided in the through hole, and the conductive paste layer electrically connects the first electrode layer to the connection electrode.

9. The display structure according to claim 8, wherein the conductive paste layer is made of Ag paste or Cu paste.

10. The display structure according to claim 1, wherein a height of the post spacer is greater than 10 um.

11. The display structure according to claim 5, wherein the flexible back plate further comprises a flexible base substrate and a first electrode layer formed on the flexible base substrate, a metal conductive layer is formed on the first electrode layer, and the metal conductive layer electrically connects the first electrode layer to the connection electrode.

12. The display structure according to claim 5, wherein the drive circuit layer further comprises a contact electrode configured to be connected to a light emitting unit disposed on the display substrate, and the connection electrode is connected to the contact electrode.

13. The display structure according to claim 5, wherein the connection electrode is located on a top of the drive circuit layer.

14. The display structure according to claim 1, wherein a heat-resistant adhesive layer is provided on the flexible back plate, and the heat-resistant adhesive layer is located between the flexible back plate and the display substrate.

15. A display apparatus, comprising the display structure according to claim 1.

16. A preparation method for a display structure, comprising:
    attaching a display substrate to a flexible back plate; and
    bending the flexible back plate to form a bent portion, a bonding electrode on the flexible back plate being located on the bent portion,
    wherein the flexible back plate further comprises a flexible base substrate, a post spacer formed on the flexible base substrate, and a first electrode layer formed on the flexible base substrate and the post spacer, and
    wherein the flexible back plate further comprises a passivation layer formed on the first electrode layer other than the post spacer, the passivation layer is provided with an opening communicating with the first electrode layer, and the bonding electrode is formed on the passivation layer and electrically connected to the first electrode layer through the opening.

* * * * *